United States Patent
Gomez et al.

(10) Patent No.: US 9,739,839 B2
(45) Date of Patent: Aug. 22, 2017

(54) METHOD OF OPERATING A STATIONARY ELECTRICAL POWER PLANT CONNECTED TO A POWER SUPPLY NETWORK

(71) Applicant: GE Jenbacher GmbH & Co OG, Jenbach (AT)

(72) Inventors: Jose Gomez, Reutlingen (DE); Erich Kruckenhauser, Muenster (AT)

(73) Assignee: GE JENBACHER GMBH & CO OG, Jenbach (AT)

( * ) Notice: Subject to any disclaimer, the term of this patent is extended or adjusted under 35 U.S.C. 154(b) by 148 days.

(21) Appl. No.: 14/520,715

(22) Filed: Oct. 22, 2014

(65) Prior Publication Data

US 2015/0109021 A1   Apr. 23, 2015

(30) Foreign Application Priority Data

Oct. 23, 2013   (AT) .................. A 819/2013

(51) Int. Cl.
| | |
|---|---|
| *G01R 31/40* | (2014.01) |
| *G01R 31/02* | (2006.01) |
| *F02D 29/06* | (2006.01) |
| *G05B 23/02* | (2006.01) |

(52) U.S. Cl.
CPC ............ G01R 31/40 (2013.01); F02D 29/06 (2013.01); G01R 31/025 (2013.01); G05B 23/0259 (2013.01)

(58) Field of Classification Search
CPC ........ G01R 31/40; G01R 31/42; G01R 31/34; G01R 31/343; G01R 31/346; G01R 31/025
See application file for complete search history.

(56) References Cited

U.S. PATENT DOCUMENTS

| | | |
|---|---|---|
| 7,525,208 B2 | 4/2009 | Wobben |
| 2003/0114965 A1 | 6/2003 | Fiechter et al. |
| 2006/0025908 A1 | 2/2006 | Rachlin |
| 2007/0005527 A1 | 1/2007 | Parthasarathy |

(Continued)

FOREIGN PATENT DOCUMENTS

| | | |
|---|---|---|
| CN | 1856920 | 11/2006 |
| CN | 103150633 | 6/2013 |

(Continued)

OTHER PUBLICATIONS

European Search Report issued Apr. 6, 2016 in corresponding European Application No. 14003560 (with English translation).

(Continued)

*Primary Examiner* — Tung X Nguyen
(74) *Attorney, Agent, or Firm* — GE Global Patent Operation

(57) ABSTRACT

In a method of operating a stationary power plant connected to a power supply network, wherein upon the occurrence of a dynamic network fault in the power supply network, (in particular an electric short-circuit), at least one fault value is ascertained depending on a state value of at least one operating parameter of the power plant. The at least one fault value is associated with at least one component of the power plant, and a maintenance signal for the at least one component of the power plant is output depending on the at least one fault value.

16 Claims, 1 Drawing Sheet

(56) References Cited

U.S. PATENT DOCUMENTS

| | | |
|---|---|---|
| 2007/0159737 A1 | 7/2007 | Wobben |
| 2008/0228338 A1 | 9/2008 | Howard et al. |
| 2009/0001940 A1* | 1/2009 | Sihler .................. H02J 3/24 322/58 |
| 2012/0078578 A1 | 3/2012 | Piccirillo et al. |
| 2014/0195184 A1 | 7/2014 | Maeda et al. |

FOREIGN PATENT DOCUMENTS

| | | |
|---|---|---|
| CN | 103308824 | 9/2013 |
| DE | 102 35 525 | 4/2003 |
| EP | 1 970 786 | 9/2008 |
| JP | 4-4797 | 1/1992 |
| JP | 2006-90173 | 4/2006 |
| JP | 2008-50985 | 3/2008 |
| JP | 2009-203882 | 9/2009 |
| JP | 2011-10377 | 1/2011 |
| JP | 2012-75308 | 4/2012 |
| KR | 100553032 | 6/2005 |
| WO | 2013/024613 | 2/2013 |

OTHER PUBLICATIONS

Chinese Search Report issued Jun. 3, 2016 in corresponding Application No. 201410858125.8.

An Unofficial KR Office Action issued in connection with corresponding Application No. 10-2014-0143538 on Jul. 24, 2015.

Austrian Patent Office Search Report (ASR) issued Jul. 30, 2014 in Austrian Patent Application A 819/2013.

English translation of Japanese Office Action issued Nov. 4, 2015 in corresponding Japanese Patent Application No. 2014-213349.

"Nyumon Koza [Denryokukeito no Unyo to Denkisetsubi]," (2008 revised edition) Chapter 6, The Thermal and Nuclear Power Engineering Society, Nov. 15, 2008, vol. 59, pp. 69-73; cited and discussed in Japanese Office Action of Nov. 4, 2015 (Reference CA).

* cited by examiner

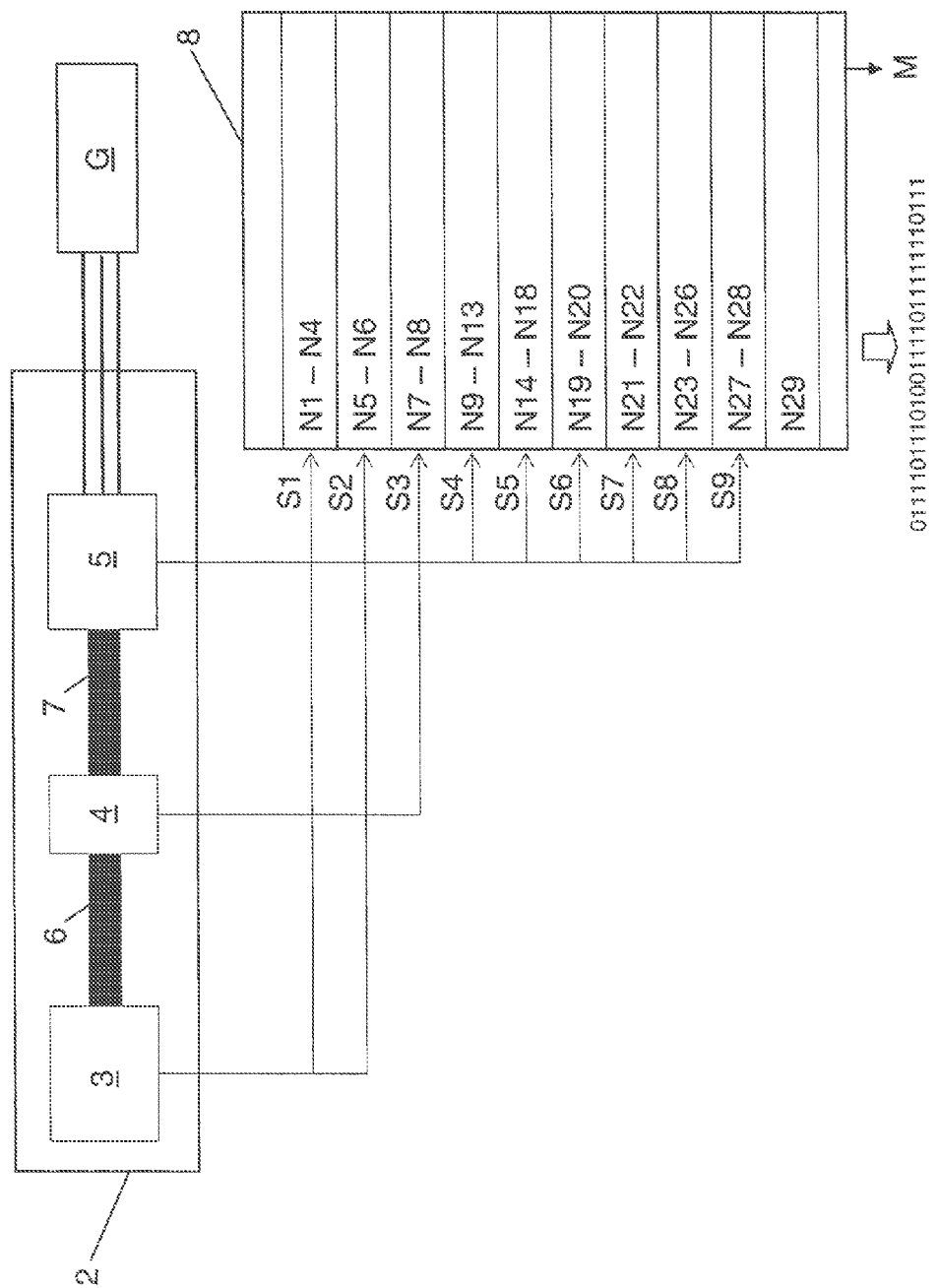

METHOD OF OPERATING A STATIONARY ELECTRICAL POWER PLANT CONNECTED TO A POWER SUPPLY NETWORK

BACKGROUND OF THE INVENTION

The invention concerns a method of operating a stationary electrical power plant connected to a power supply network. Upon the occurrence of a dynamic network fault in the power supply network, in particular an electric short-circuit, at least one fault value is ascertained depending on a state value of at least one operating parameter of the power plant.

Dynamic network faults, in particular electric short-circuits, in power supply networks (e.g. in the public grid) can cause high loads to components connected to the network. Dynamic network (grid) faults are voltage dips or voltage fluctuations in a duration range of a few hundred milliseconds (ms) up to for instance 700 ms, in particular below 500 ms. Parallel mode means that the grid dictates the nominal voltage and nominal frequency, as well as the phase of the AC voltage of the AC generator. Particularly in the case of a power plant connected to a power supply network, short-circuits cause high current strengths in the stator windings, connected to the power supply network, of an electric generator of the power plant, which as a further consequence can also result in high current flows in the rotor windings of the generator. In addition, high short-circuit currents cause an increase in the torque acting on the generator shaft connected to the rotor. The generator shaft is generally connected to the shaft of an internal combustion engine by a coupling device whereby a torque produced in that way can be transmitted to the internal combustion engine by way of the coupling device and can bring about unwanted vibration and oscillations in the internal combustion engine.

In order to counteract such network faults and to promote the stability of a power plant during and after the network fault, a regulating device for the internal combustion engine, can make suitable counter-measures. Thus, the synchronicity of the generator with the power supply network is maintained by the mechanical power of the internal combustion engine connected to the generator being suitably adapted to the electric power which can be delivered by the generator to the power supply network. That can be effected, for example, by adaptations in respect of the combustion process, like for example a delay in or interruption of ignition or a change in position of corresponding actuators of the internal combustion engine (for example butterfly valve or fuel metering valve).

To prevent damage to the power plant as a result of network faults, in particular electric short-circuits, or to minimize same, maintenance plans usually specify that maintenance is effected after a certain number of short-circuits occurring. In that respect, however, no distinction is drawn as to whether the network fault or short-circuit which has occurred is a serious network fault or only a minor network fault. The reaction of the power plant or its components (for example generator, coupling, internal combustion engine) to the network fault is also not taken into consideration in previously known maintenance plans. As a result, a maintenance plan can provide for maintenance of the power plant immediately after a fault although the fault which has occurred was only a minor network fault which had scarcely any effects on the power plant. On the other hand, a maintenance plan can provide for maintenance of the power plant only after a number of electric short-circuits have occurred, in which respect the first network fault which has occurred already had a high damage potential. In addition, known maintenance plans also fail to provide information about the components of the power plant to be investigated, in the next maintenance operation.

SUMMARY OF THE INVENTION

Therefore, the object of the invention is to avoid the above-described disadvantages and to provide a method which is improved over the state of the art of operating a power plant connected to a power supply network when a network fault occurs. In particular, the invention seeks to achieve that object by permitting the output of a specific and/or qualitative maintenance recommendation.

In accordance with the invention, therefore, the at least one fault value is associated with at least one component of the power plant, and a maintenance signal for the at least one component of the power plant is output depending on the at least one fault value.

By virtue of interrogating state values of operating parameters of the power plant, determining fault values depending on the state values and the proposed association of the fault values with components of the power plant, it is possible on the one hand to detect operating parameters or components of the power plant with abnormalities. On the other hand, it is possible, depending on the fault values in respect of the operating parameters, to ascertain specifically directed maintenance signals for individual components of the power plant and to output same. Unlike known maintenance plans, the focus is therefore not just on the number of network faults which have occurred, but specific information is possible as to whether, after a network fault which has occurred, a component of the power plant—and if so which component—is to be maintained.

To ascertain the at least one fault value, the state value of the at least one operating parameter of the power plant is ascertained prior to the network fault and/or during the network fault and/or after the network fault.

According to a preferred embodiment it can be provided that the fault value is ascertained depending on the state value of the at least one operating parameter and at least one predeterminable reference value. A reference value can be, for example, a threshold value, and the fault value can be dependent on whether the state value of an operating parameter exceeds or falls below the threshold value.

The operating parameters can be, for example, one or more of the operating parameters listed hereinafter.

Operating Parameters in Relation to Ignition:

As a consequence of a network fault, in particular a short-circuit, and to maintain the synchronicity of the generator with the power supply network, an engine regulating system of the internal combustion engine can provide a delayed or interrupted ignition to keep the rotary speed of the internal combustion engine and the generator and thus the synchronicity of the generator with the power supply network at the desired level.

An interruption or delay in ignition, however, represents an abnormal operating state and can also be a possible cause of unwanted misfires.

Possible state values to be ascertained of operating parameters in relation to ignition can be: the occurrence of a delay in the ignition time, the occurrence of an interruption in combustion and the duration of an interruption in combustion.

Operating Parameters in Relation to the Turbocharger:

In the case of an internal combustion engine charged by a turbocharger, sudden changes in state of the fuel-air mixture to be introduced into the combustion chambers and/or sudden changes in state of the exhaust gas flowing out of the combustion chambers can lead to the turbocharger being throttled back. In that case, throttling of the turbocharger can lead to a reverse flow of the fuel-air mixture and consequently an unwanted acceleration of the turbocharger, for example due to enrichment of the fuel-air mixture during the network fault.

Possible state values to be ascertained in respect of operating parameters in relation to the turbocharger can be: the occurrence of a throttling of the turbocharger, and the duration of a throttling of the turbocharger.

Operating Parameters in Relation to Torque:

A short-circuit in the power supply network and the high current linked thereto in the stator windings of an electric generator connected to the power supply network can lead to a sudden increase in a torque acting on the rotor of the generator. Such sudden increases in torque can have a negative effect on the internal combustion engine connected to the rotor of the generator or on a coupling device arranged between the internal combustion engine and the generator.

Possible state values to be ascertained in respect of operating parameters in relation to torque can be: the level of the torque at the generator shaft, the level of the torque at the coupling device and the level of the torque at the engine shaft.

Operating Parameters in Relation to Electric Voltage:

As a result of a short-circuit, the electric voltage falls in at least one phase of a power supply network which is usually of a three-phase nature. The lowest voltage value occurring then and the duration of the voltage drop can be used to determine the degree of severity of the network fault.

Possible state values to be ascertained in respect of operating parameters in relation to electric voltage can be: the level of the electric voltage of the generator, the occurrence of a voltage drop, and the duration of a voltage drop.

Operating Parameters in Relation to the Electric Current:

As a result of a short-circuit, a current rise occurs in at least one phase of a power supply network which is usually of a three-phase nature. In that case a high current strength increases the thermal loading on the electrical components and can lead to high electromagnetic forces which can lead to damage.

Possible state values to be ascertained in respect of operating parameters in relation to the electric current can be: the level of the electric current of the generator, the occurrence of an increase in current strength, and the duration of an increase in current strength.

Operating Parameters in Relation to Electric Active Power:

As the active power is related to torque by way of the rotary speed, the active power can also be used alternatively or additionally for the evaluation of torque. In that case, the electric active power can be ascertained from voltage, current and power factor measurements and is proportional to the torque.

Possible state values to be ascertained in respect of operating parameters in relation to the electric active power can be: the level of the electric active power delivered by the power plant or by the generator of the power plant to the power supply network.

Operating Parameters in Relation to the Rotary Speed:

During a short-circuit, the imbalance between the mechanical power applied to the generator by the internal combustion engine and the electric power delivered by the generator to the power supply network involves a deviation in the rotary speed from the desired rated rotary speed value. In that case, fluctuations can occur, which can lead to loadings on mechanical components (for example coupling device) connected to the engine shaft of the internal combustion engine.

Possible state values to be ascertained in respect of operating parameters in relation to the rotary speed can be: the level of the rotary speed of the generator shaft, the level of the rotary speed of the coupling device, and the level of the rotary speed of the engine shaft.

Operating Parameters in Relation to the Load Angle:

As is known, the angle between the vector of the rotating magnetic field in the stator of the generator and the vector of the rotating magnetic field in the rotor of the generator is referred to as the load angle. The load angle is a measurement of electrical coupling of the generator to the power supply network and determines the efficiency of delivery of electric power to the power supply network. High deviations in the load angle from the desired nominal value can lead to high electromechanical forces and torques on the rotor of the generator and consequently on the coupling device and the internal combustion engine.

Possible state values to be ascertained in respect of operating parameters in relation to the load angle can be: the level of the load angle, and the level of the load angle after elimination of the network fault.

Operating Parameters in Relation to the Exciter Current:

The exciter current determines the level of the field current in the rotor windings of the generator. In particular, a greatly increased exciter current and damage to the winding insulation or a rectifier bridge connected to the rotor windings can occur due to an armature reaction, as a consequence of a short-circuit. The stator currents in the stator windings of the generator, which are increased in the event of a short-circuit, induce correspondingly high currents in the rotor windings of the generator, which can lead to damage to the winding insulation. The high induction voltage which occurs as a consequence of a current flow blocked by a rectifier can in turn lead to damage to diodes in the rectifier.

Possible state values to be ascertained in respect of operating parameters in relation to the exciter current or exciter circuit can be: the level of the exciter current, and the duration of a given exciter current strength.

Preferably, the power plant includes at least one of the following components: an electric generator connected to the power supply network, an internal combustion engine connected to the generator, and a coupling device for connecting a rotatably mounted generator shaft of the generator to a rotatably mounted engine shaft of the internal combustion engine. At least one fault value is ascertained based on on a state value of at least one operating parameter of the generator and/or the internal combustion engine and/or the coupling device, and is associated with at least one component of the power plant.

A component of the power plant can also be an individual part of the internal combustion engine, the generator, or the coupling device. Thus, stator windings, rotor windings or a rectifier bridge of the generator can also be respectively viewed as a component of the power plant.

Preferably, at least one of the following state values of operating parameters of the power plant is ascertained: the occurrence of a delay in the ignition time of the internal combustion engine, the occurrence of an interruption in combustion of the internal combustion engine, the duration of an interruption in combustion of the internal combustion engine, the occurrence of a throttling of a turbocharger of the internal combustion engine, the duration of a throttling of the turbocharger of the internal combustion engine, the level of the torque at the generator shaft of the generator, the level of the torque at the coupling device, the level of the torque at the engine shaft of the internal combustion engine, the level of the electric voltage of the generator, the occurrence of a voltage drop at the generator, the duration of a voltage drop at the generator, the level of the electric current of the generator, the occurrence of an increase in current strength of the generator, the duration of an increase in current strength of the generator, the level of the electrical active power delivered by the generator to the power supply network, the level of the rotary speed of the generator shaft of the generator, the level of the rotary speed of the coupling device, the level of the rotary speed of the engine shaft of the internal combustion engine, the level of the load angle of the generator, the level of the load angle of the generator after elimination of the network fault, and the level of the exciter current of the generator and the duration of a given exciter current strength of the generator.

In a preferred variant, a plurality of fault values is ascertained.

In a preferred embodiment of the invention, a respective fault value has one of at least two possible values, wherein preferably the at least two possible values are 0 and 1.

In that respect, fault values of one or more of the following operating parameters by way of example are ascertained depending on their respective state value, wherein a respective fault value is either of the value 0 or the value 1. In that respect, the fault values are specified for example by "N" and a number for distinguishing the fault values. In relation to fault values which are ascertained depending on the state value and a predeterminable reference value or threshold value the respective reference value or threshold value is specified for example with "P" and a number for distinguishing the reference values or threshold values.

Fault values of operating parameters in relation to the ignition of the internal combustion engine:
N1: Occurrence of a delay in the ignition time
N2: Occurrence of an interruption in combustion (for example no ignition)
N3: Occurrence of an interruption in combustion, wherein the duration of the interruption in combustion is at least P3 milliseconds
N4: Occurrence of an interruption in combustion, wherein the duration of the interruption in combustion is at least P4 milliseconds.
  Fault values of operating parameters in relation to the turbocharger of the internal combustion engine:
N5: Occurrence of a throttling of the turbocharger
N6: Occurrence of a throttling of the turbocharger, wherein the duration of the throttling of the turbocharger is at least P6 milliseconds.
  Fault values of operating parameters in relation to the torque at the engine shaft of the internal combustion engine and/or at the coupling device and/or at the generator shaft of the generator:
N7: The torque at the coupling device exceeds an allowed maximum of P7 kN*m or per unit (p.u.)
N8: The torque at the coupling device exceeds an allowed maximum of P8 kN*m or p.u.
  Fault values of operating parameters in relation to the electric voltage of the generator:
N9: Occurrence of a voltage drop of the generator to below P9 percent of a nominal output voltage of the generator
N10: Occurrence of a voltage drop to below P9 percent, wherein the duration of the voltage drop to below P9 percent is at least P10 milliseconds
N11: Occurrence of a voltage drop to below P11 percent
N12: Occurrence of a voltage drop to below P11 percent, wherein the duration of the voltage drop to below P11 percent is at least P12 milliseconds
N13: Occurrence of two successive voltage drops to below P13a percent within P13b seconds.
  Fault values of operating parameters in relation to the electric current of the generator:
N14: Occurrence of an increase in current strength of the generator to over P14 amps or p.u.
N15: Occurrence of an increase in current strength of the generator to over P14 amps or p.u., wherein the duration of the increase in current strength to at least P14 amps or p.u. is over P15 milliseconds
N16: Occurrence of an increase in current strength of the generator to over P16 amps or p.u.
N17: Occurrence of an increase in current strength of the generator to over P16 amps of p.u., wherein the duration of the increase in current strength to at least P16 amps or p.u. is over P17 milliseconds
N18: Occurrence of two successive increases in current strength of the generator to over P18a amps or p.u. within P18b seconds.
  Fault values of operating parameters in relation to the electrical active power of the generator:
N19: Occurrence of an active power over P19 kilowatts or p.u.
N20: Occurrence of an active power below P20 kilowatts or p.u.
  Fault values of operating parameters in relation to the rotary speed of the engine shaft of the internal combustion engine and/or of the coupling device and/or of the generator shaft of the generator:
N21: Occurrence of a rotary speed over P21 revolutions per minute
N22: Occurrence of a rotary speed over P22 revolutions per minute
  Fault values of operating parameters in relation to the load angle of the generator:
N23: Occurrence of a load angle over P23 degrees
N24: Occurrence of a load angle below P24 degrees
N25: Occurrence of a load angle over P25 degrees after the network fault was eliminated
N26: Occurrence of a load angle above the slip limit.
  Fault values of operating parameters in relation to the exciter current of the generator:
N27: Occurrence of an exciter current over P27 percent of a nominal current of the generator
N28: Occurrence of an exciter current over P27 percent for P28 milliseconds.

A fault value can also be ascertained from a linking of two or more other fault values or depending on the state values of a plurality of operating parameters. For example, a fault value can be ascertained for the situation where the active power is higher than P30 kilowatts and load angle is above the slip limit:
N29: Occurrence of an active power of over P30 kilowatts and occurrence of a load angle above the slip limit.

A particular variant provides that a degree of severity of the network fault is ascertained and/or output depending on the at least one fault value.

A degree of severity of the network fault can be ascertained and output depending (based on) on the number of fault values of a predeterminable value, wherein preferably the predeterminable value is 1. Therefore, for example, depending on the number of fault values of the value 1, a network fault is classified as a slight network fault or as a severe network fault and suitable maintenance recommendations are output depending on that degree of severity of the network fault. By establishing and outputting the degree of severity of a network fault it is possible to deliver qualitative maintenance recommendations which, unlike known maintenance plans, do not focus solely on the number of network faults which have occurred, but take account of the severity of a network fault, by establishing whether the network fault which has occurred was a severe network fault or for example only a minor one.

It can also be provided that the at least one maintenance signal is output in dependence on the value of at least one fault value. For the situation where a fault value can only be of the two values 0 and 1, this permits particularly simple ascertainment of a maintenance signal to be output.

Table 1 hereinafter shows two examples of network faults (a slight network fault and a severe network fault) and the fault values caused thereby in respect of monitored operating parameters based on their state values and possibly predetermined reference values. In that case, the left-hand column 1 of the Table denotes the respective operating parameter group, column 2 specifies the fault values of the respective operating parameter of the operating parameter group in accordance with the preceding description, column 3—where appropriate—specifies the respective reference value for ascertaining the fault value in accordance with the preceding description, column 4 shows the value of the respective fault value for the example of the slight network fault, and column 5 shows the value of the respective fault value for the example of the severe network fault. In the case of the slight network fault, seven fault values are of the value 1 while in the case of the severe network fault 22 fault values are of the value 1.

TABLE 1

Examples of slight and severe network faults

| Operating parameter group | Fault value | Reference value (if present) | Value of the fault value (slight network fault) | Value of the fault value (severe network fault) |
|---|---|---|---|---|
| Ignition | N1 | | 0 | 0 |
| | N2 | | 1 | 1 |
| | N3 | P3 = 40 ms | 1 | 1 |
| | N4 | P4 = 120 ms | 0 | 1 |
| Turbocharger | N5 | | 0 | 1 |
| | N6 | P6 = 50 ms | 0 | 0 |
| Torque | N7 | P7 = 9 kN * m (2 p.u.) | 1 | 1 |
| | N8 | P8 = 13.5 kN * m (3 p.u.) | 0 | 1 |
| Electric voltage | N9 | P9 = 50% | 1 | 1 |
| | N10 | P9 = 50% | 0 | 0 |
| | | P10 = 150 ms | | |
| | N11 | P11 = 15% | 0 | 1 |
| | N12 | P11 = 15% | 0 | 0 |
| | | P12 = 150 ms | | |
| | N13 | P13a = 50% | 0 | 0 |
| | | P13b = 3 s | | |
| Electric current | N14 | P14 = 2000 A (2 p.u.) | 1 | 1 |
| | N15 | P14 = 2000 A (2 p.u.) | 1 | 1 |
| | | P15 = 5 ms | | |
| | N16 | P16 = 5000 A (5 p.u.) | 0 | 1 |
| | N17 | P16 = 5000 A (5 p.u.) | 0 | 1 |
| | | P17 = 5 ms | | |
| | N18 | P18a = 2000 A (2 p.u.) | 0 | 0 |
| | | P18b = 3 s | | |
| Electric active power | N19 | P19 = 2 p.u. | 0 | 1 |
| | N20 | P20 = 2 p.u. | 0 | 1 |
| Rotary speed | N21 | P21 = 1600 rpm | 0 | 1 |

TABLE 1-continued

Examples of slight and severe network faults

| Operating parameter group | Fault value | Reference value (if present) | Value of the fault value (slight network fault) | Value of the fault value (severe network fault) |
|---|---|---|---|---|
| | N22 | P22 = 1400 rpm | 0 | 1 |
| Load angle | N23 | P23 = 120° | 0 | 1 |
| | N24 | P24 = 100° | 0 | 1 |
| | N25 | P25 = 100° (absolute) | 0 | 1 |
| | N26 | | 0 | 0 |
| Exciter current | N27 | P27 = 250% | 1 | 1 |
| | N28 | P27 = 250% | 0 | 1 |
| | | P28 = 200 ms | | |
| Linking of operating parameters | N29 | P30 = 2000 kW | 0 | 1 |

In a particularly preferred embodiment, depending on the at least one fault value and/or the severity of the network fault, a maintenance signal is output for at least one component of the power plant, preferably for the generator and/or the internal combustion engine and/or the coupling device.

Table 2 hereinafter shows by way of example maintenance signals for the components, internal combustion engine, coupling device and generator of the power plant, depending on fault values in accordance with the preceding description. A maintenance signal "Yes" in the Table signifies in this example a maintenance recommendation for the corresponding component for the situation where the respective fault value is of the value 1. Correspondingly, a maintenance signal "No" in the Table signifies that no maintenance recommendation in relation to the respective fault value is output for the corresponding component.

TABLE 2

Maintenance signals for components of the power plant

| Fault value (respective value = 1) | Maintenance signal for internal combustion engine | Maintenance signal for coupling | Maintenance signal for generator |
|---|---|---|---|
| N1 | Yes | No | No |
| N2 | Yes | No | No |
| N3 | Yes | No | No |
| N4 | Yes | No | No |
| N5 | Yes | No | No |
| N8 | No | Yes | Yes |
| N9 | Yes | Yes | Yes |
| N13 | No | No | Yes |
| N18 | No | No | Yes |
| N21 | Yes | Yes | Yes |
| N27 | Yes | Yes | Yes |
| N29 | No | No | Yes |
| N30 | No | Yes | yes |

A component of the power plant may also be an individual part of the internal combustion engine, the generator or the coupling device. Thus, stator windings, rotor windings or a rectifier bridge of the generator can also each be viewed as a component of the power plant. Table 3 hereinafter shows by way of example maintenance signals for the components stator windings, rotor windings and rectifier bridge of the generator of the power plant depending on fault values in accordance with the preceding description. A maintenance signal "Yes" in the Table signifies in this example a maintenance recommendation for the corresponding component for the situation where the respective fault value is of the value 1. Correspondingly a maintenance signal "No" in the Table signifies that no maintenance recommendation is output in relation to the respective fault value, for the corresponding component.

TABLE 3

Maintenance signals for components of the generator of the power plant

| Fault value (respective value = 1) | Maintenance signal for stator windings | Maintenance signal for rotor windings | Maintenance signal for rectifier bridge |
|---|---|---|---|
| N8 | No | No | Yes |
| N9 | Yes | Yes | Yes |
| N13 | Yes | Yes | No |
| N18 | Yes | No | Yes |
| N21 | Yes | Yes | Yes |
| N27 | No | No | Yes |
| N29 | Yes | No | No |
| N30 | No | Yes | yes |

Preferably, the internal combustion engine is a stationary internal combustion engine, in particular a reciprocating gas engine.

BRIEF DESCRIPTION OF THE DRAWINGS

Further details and advantages of the present invention are described by means of the specific description hereinafter.

FIG. 1 is a schematic block circuit diagram of a power plant 2 including an internal combustion engine 3, an electric generator 5 and a coupling device 4 for connecting a rotatably mounted engine shaft 6 of the internal combustion engine 3 to a rotatably mounted generator shaft 7 of the generator 5. The electric generator 5 of the power plant 2 is electrically connected to a power supply network G. In the present example, the power supply network G is of a three-phase nature.

DETAILED DESCRIPTION OF THE INVENTION

To be able to deliver a specific maintenance recommendation in the event of the occurrence of a network fault, in particular an electric short-circuit, in the power supply network G, a plurality of operating parameters of the power plant 2 are monitored. In particular, upon the occurrence of a network fault in the power supply network G, state values S1 through S9 of various operating parameters of the components being the internal combustion engine 3, coupling device 4 and generator 5 of the power plant are ascertained and signaled to a monitoring device 8. The state values S1 through S9 of operating parameters of the power plant 2 can be for example the occurrence of a delay in the ignition time of the internal combustion engine 3, the level of the torque at the coupling device 4 or the level of the load angle of the generator 5.

Depending on the signaled state values S1 through S9 of the operating parameters of the power plant 2, the monitoring device 8 ascertains fault values N1 through N29, possibly using predeterminable reference values for the state values S1 through S9. In the present case, the monitoring device 8 ascertains from the signaled state value S1 for example the four fault values N1 through N4. Examples for ascertaining the fault values N1 through N29 are set forth in the preceding description.

In this respect, in the present example, a respective fault value N1 through N29 is of one of two possible values. Thus, a fault value N1 through N29 can either be of the value 0 or the value 1, in which example a fault value N1 through N29 is of the value 1 when a fault is present and the value 0 when there is no fault. The individual fault values N1 through N29 can also be output by the monitoring device 8. That is indicated in the illustration by the sequence of digits formed from the values 0 and 1. In the present case, therefore, a total of 22 of the fault values N1 through N29 are each of the value 1 so that in total there are 22 fault messages.

The fault values N1 through N29 ascertained by the monitoring device 8 are respectively associated with a component of the power plant 2, in which respect the internal combustion engine 3, the engine shaft 6, the coupling device 4, the generator shaft 7 and the generator 5 can be viewed as components of the power plant. A component of the power plant however can also be an individual part of the internal combustion engine 3, of the generator 5 or of the coupling device 4.

Depending on the association of a fault value N1 through N29 with a component of the power plant 2, a maintenance signal M for the corresponding component of the power plant 2 is output based on the respective fault value N1 through N29. Thus, in the illustrated example the fault value N1 is associated with the component internal combustion engine 3 of the power plant 2, in which case a maintenance signal M is output if the fault value N1 is of the value 1. The fault value N21 can also be associated with the components internal combustion engine 3, coupling device 4 and generator 5, and a maintenance signal M for all those components 3, 4, 5 is output if the fault value N1 is of the value 1. Examples for associations of fault values N1 through N29 with components 3, 4, 5 of the power plant 2 are set forth in the preceding description in Tables 2 and 3.

The invention claimed is:

1. A method of operating a stationary power plant connected to a power supply network, said method comprising:
   ascertaining at least one fault value depending on a state value of at least one operating parameter of the power plant upon the occurrence of a dynamic network fault in the power supply network;
   associating the at least one fault value with at least one component of the power plant;
   outputting a maintenance signal for the at least one component of the power plant depending on the at least one fault value; and
   at least one of ascertaining and outputting a degree of severity of the network fault based on the at least one fault value.

2. The method as set forth in claim 1, wherein the dynamic network fault in the power supply network is an electric short-circuit.

3. The method as set forth in claim 1, wherein the power supply network is a public grid.

4. The method as set forth in claim 1, wherein the power supply network is an island network.

5. The method as set forth in claim 1, wherein said ascertaining the at least one fault value comprises ascertaining the state value of the at least one operating parameter of the power plant prior to the network fault and/or during the network fault and/or after the network fault.

6. The method as set forth in claim 1, wherein said ascertaining the at least one fault value comprises ascertaining at least one fault value depending on a state value of at least one operating parameter of the power plant and at least one predeterminable reference value.

7. The method as set forth in claim 1, wherein the power plant includes an electric generator connected to the power supply network, an internal combustion engine connected to the generator, and a coupling device for connecting a rotatably mounted generator shaft of the generator to a rotatably mounted engine shaft of the internal combustion engine, said ascertaining the at least one fault value comprises ascertaining the at least one fault value based on a state value of at least one operating parameter of at least one of the generator, the internal combustion engine, and the coupling device, and the at least one fault value is associated with at least one component of the power plant.

8. The method as set forth in claim 7, wherein said ascertaining the at least one fault value comprises ascertaining at least one of (i) an occurrence of a delay in the ignition time of the internal combustion engine, (ii) an occurrence of an interruption in combustion of the internal combustion engine, (iii) a duration of an interruption in combustion of the internal combustion engine, (iv) an occurrence of a throttling of a turbocharger of the internal combustion engine, (v) a duration of a throttling of the turbocharger of the internal combustion engine, (vi) a level of the torque at the generator shaft of the generator, (vii) a level of the torque at the coupling device, (viii) a level of the torque at the engine shaft of the internal combustion engine, (ix) a level of the electric voltage of the generator, (x) an occurrence of a voltage drop at the generator, (xi) a duration of a voltage drop at the generator, (xii) a level of the electric current of the generator, (xiii) an occurrence of an increase in current strength of the generator, (xiv) a duration of an increase in current strength of the generator, (xv) a level of the electrical active power delivered by the generator to the power supply network, (xvi) a level of the rotary speed of the generator shaft of the generator, (xvii) a level of the rotary speed of the coupling device, (xviii) a level of the rotary speed of the engine shaft of the internal combustion engine, (xix) a level of the load angle of the generator, (xx) a level of the load angle of the generator after elimination of the network fault, and (xxi) a level of the exciter current of the generator and the duration of a given exciter current strength of the generator.

9. The method as set forth in claim 1, wherein said ascertaining the at least one fault value comprises ascertaining a plurality of fault values.

10. The method as set forth in claim 1, further comprising outputting a maintenance signal for at least one component of the power plant depending on at least one of (i) the at least one fault value and (ii) the degree of severity of the network fault.

11. The method as set forth in claim 10, wherein the at least one component of the power plant is at least one of (i) a generator, (ii) an internal combustion engine, or (iii) a coupling device.

12. The method as set forth in claim 1, wherein a respective fault value has one of at least two possible values.

13. The method as set forth in claim 12, wherein the at least two possible values are 0 and 1.

14. The method as set forth in claim 12, further comprising outputting at least one maintenance signal depending on the one of at least two possible values of the at least one fault value.

15. The method as set forth in claim 12, wherein said at least one of ascertaining and outputting a degree of severity of the network fault comprises ascertaining and outputting the degree of severity of the network fault depending on the number of fault values of a predeterminable value.

16. The method as set forth in claim 15, wherein the predeterminable value is 1.

* * * * *